(12) United States Patent
Lee et al.

(10) Patent No.: US 10,090,181 B2
(45) Date of Patent: Oct. 2, 2018

(54) METHOD AND APPARATUS FOR SUBSTRATE TRANSFER AND RADICAL CONFINEMENT

(75) Inventors: Jared Ahmad Lee, Santa Clara, CA (US); Martin Jeffrey Salinas, Campbell, CA (US); Paul B. Reuter, Austin, TX (US); Imad Yousif, San Jose, CA (US); Aniruddha Pal, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1329 days.

(21) Appl. No.: 13/985,843

(22) PCT Filed: Feb. 29, 2012

(86) PCT No.: PCT/US2012/027097
§ 371 (c)(1),
(2), (4) Date: Dec. 9, 2013

(87) PCT Pub. No.: WO2012/148568
PCT Pub. Date: Nov. 1, 2012

(65) Prior Publication Data
US 2014/0087561 A1 Mar. 27, 2014

Related U.S. Application Data

(60) Provisional application No. 61/448,012, filed on Mar. 1, 2011.

(51) Int. Cl.
*H01L 21/67* (2006.01)
*H01L 21/683* (2006.01)
(Continued)

(52) U.S. Cl.
CPC .... *H01L 21/67742* (2013.01); *C23C 16/4586* (2013.01); *C23C 16/45517* (2013.01);
(Continued)

(58) Field of Classification Search
CPC ......... H01L 21/68742; H01L 21/67751; C23C 14/0068; C23C 16/45517
See application file for complete search history.

(56) References Cited

U.S. PATENT DOCUMENTS

| | | | | |
|---|---|---|---|---|
| 5,332,443 A | * | 7/1994 | Chew | ................. C23C 16/4583 118/715 |
| 5,643,366 A | * | 7/1997 | Somekh | ............ H01L 21/67748 118/715 |

(Continued)

FOREIGN PATENT DOCUMENTS

| | | |
|---|---|---|
| JP | 08-148473 A | 6/1996 |
| JP | 2001-257250 A | 9/2001 |

(Continued)

OTHER PUBLICATIONS

Japanese Office Action in related matter JP 2013-556824 dated Feb. 2, 2016.

(Continued)

*Primary Examiner* — Aiden Lee
(74) *Attorney, Agent, or Firm* — Patterson + Sheridan LLP

(57) ABSTRACT

Embodiments of the present invention provide an apparatus for transferring substrates and confining a processing environment in a chamber. One embodiment of the present invention provides a hoop assembly for using a processing chamber. The hoop assembly includes a confinement ring defining a confinement region therein, and three or more lifting fingers attached to the hoop. The three or more lifting fingers are configured to support a substrate outside the inner volume of the confinement ring.

15 Claims, 7 Drawing Sheets

(51) Int. Cl.
*H01L 21/677* (2006.01)
*C23C 16/455* (2006.01)
*C23C 16/458* (2006.01)
*H01L 21/687* (2006.01)
*H01L 21/306* (2006.01)

(52) U.S. Cl.
CPC ...... *H01L 21/306* (2013.01); *H01L 21/68742* (2013.01); *H01L 21/67751* (2013.01)

(56) References Cited

U.S. PATENT DOCUMENTS

| | | | | |
|---|---|---|---|---|
| 5,753,133 | A * | 5/1998 | Wong | H01L 21/68742 |
| | | | | 118/503 |
| 5,904,799 | A * | 5/1999 | Donohoe | H01J 37/32082 |
| | | | | 118/723 ER |
| 5,976,310 | A * | 11/1999 | Levy | H01J 37/32623 |
| | | | | 156/345.1 |
| 6,143,082 | A * | 11/2000 | McInerney | C23C 16/4412 |
| | | | | 118/719 |
| 6,257,168 | B1 * | 7/2001 | Ni | H01J 37/32623 |
| | | | | 118/723 R |
| 2002/0104751 | A1 | 8/2002 | Drewery et al. | |
| 2002/0144786 | A1 * | 10/2002 | Chiang | C23C 16/0227 |
| | | | | 156/345.51 |
| 2003/0092278 | A1 * | 5/2003 | Fink | H01J 37/32623 |
| | | | | 438/710 |
| 2007/0102286 | A1 | 5/2007 | Scheible et al. | |

FOREIGN PATENT DOCUMENTS

| | | |
|---|---|---|
| JP | 2003100851 A | 4/2003 |
| JP | 2008/532287 A | 8/2008 |
| KR | 10-2007-0031230 A1 | 3/2007 |
| KR | 20070031232 A | 3/2007 |
| WO | 2006/091588 A2 | 8/2006 |

OTHER PUBLICATIONS

TW Office Action in related application TW 101106773 dated Dec. 18, 2015.
International Search Report and Written Opinion dated Oct. 4, 2012 for PCT/US2012/027097.
Korean Office Action (with attached English translation) for Application No. 10-2013-7023302; dated Feb. 23, 2018; 10 total pages.

* cited by examiner

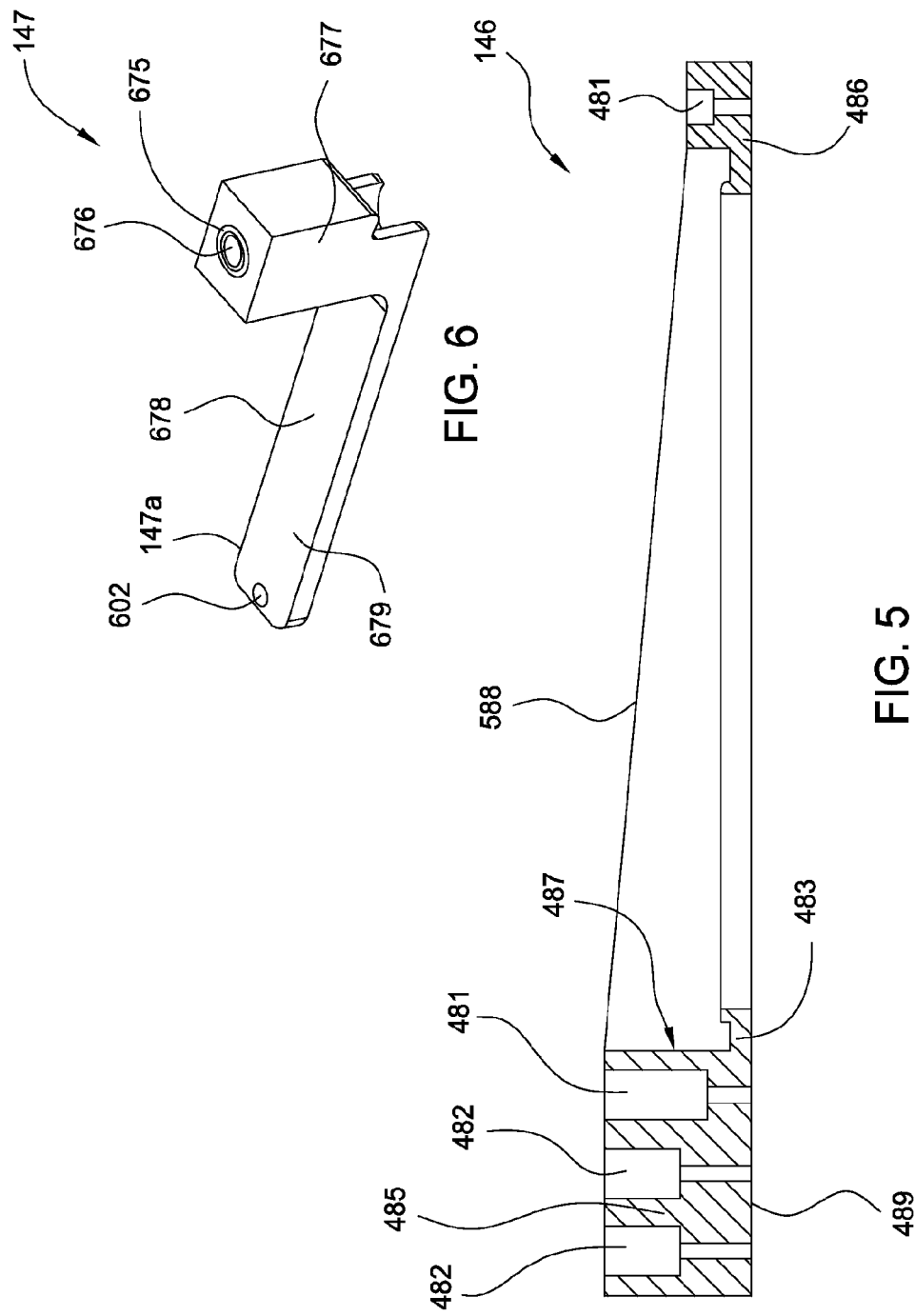

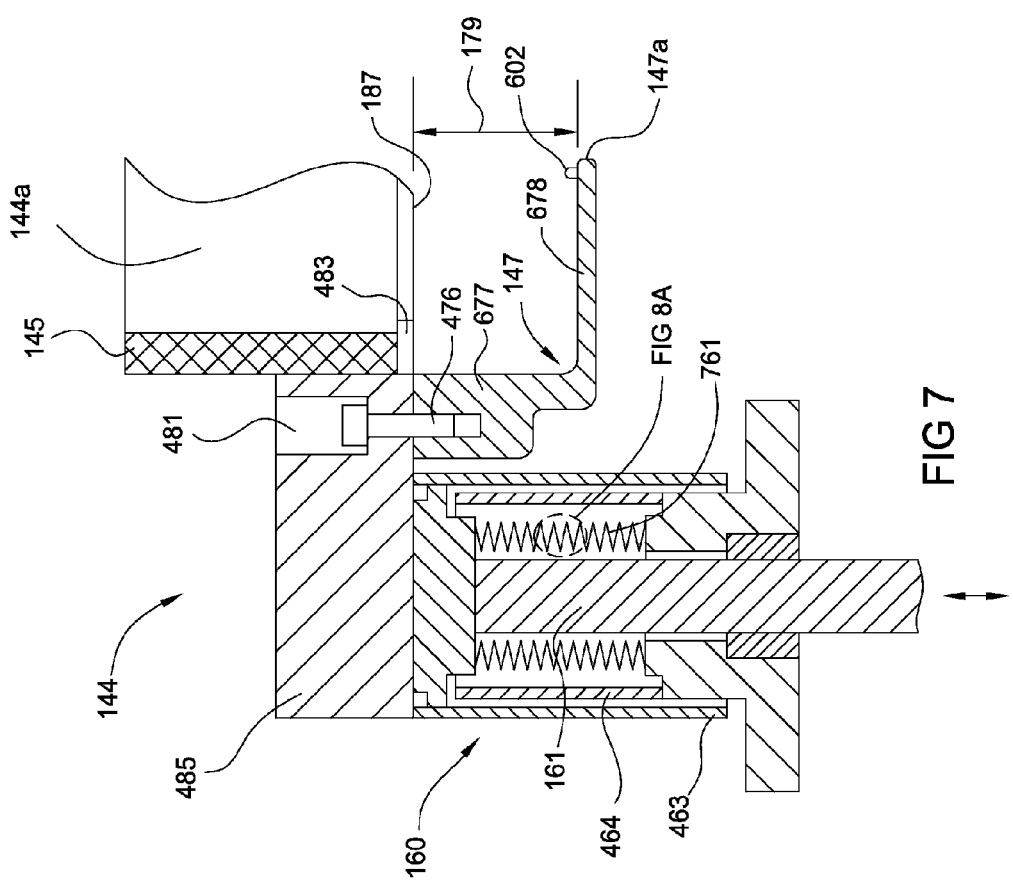

METHOD AND APPARATUS FOR SUBSTRATE TRANSFER AND RADICAL CONFINEMENT

BACKGROUND

Field

Embodiment of the present invention generally relates to a method and apparatus for fabricating devices on a semiconductor substrate. More particularly, embodiments of the present invention provide an apparatus for transferring substrates and confining a processing environment in a chamber.

Description of the Related Art

During manufacturing of semiconductor devices, a substrate is usually processed in a processing chamber, where deposition, etching, thermal processing may be performed to the substrate. Improving processing uniformity and reducing particle contamination are two constant goals for semiconductor processing, especially as dimension of semiconductor devises rapidly reduces.

A semiconductor processing chamber generally includes a chamber body defining an inner volume for processing a substrate. A substrate support is usually disposed in the inner volume to support the substrate during processing. One or more slit valve doors may be formed through the chamber body to allow passage of the substrate in and out the inner volume. Gas supply paths and pumping channels are also formed through the chamber body to provide processing gas and pump the inner volume to desired pressure. The slit valve opening, the gas supply paths, the pumping channels, and the substrate support usually cause the inner wall of the chamber body to be asymmetrical and/or irregular, thus causing non-uniform conductance and/or electric field asymmetries. As a result, different areas on the substrate may be exposed to different processing conditions and the uniformity of the processing across the substrate decreases. Furthermore, the processing gas may travel to the slit valve area and cause contamination around the slit valve area.

Therefore, there is a need for methods and apparatus for improving process uniformity and reducing contamination in a semiconductor processing chamber.

SUMMARY

Embodiments of the present invention generally provide apparatus and methods for processing a substrate. More particularly, embodiments of the present invention provide an apparatus for transfer substrates and confining a processing environment in a chamber.

One embodiment of the present invention provides a hoop assembly for using a processing chamber. The hoop assembly includes a confinement ring defining a confinement region therein, and three or more lifting fingers extending below the confinement ring. Each of the three or more lifting fingers has a contact tip positioned radially inward from the confinement ring to form a substrate support surface below and spaced apart from the confinement region defined by the confinement ring.

Another embodiment of the present invention provides a chamber for processing a substrate. The chamber includes a chamber body defining a chamber volume therein, a substrate support pedestal assembly disposed in the chamber volume, and a hoop assembly moveable within the chamber volume. The chamber body has sealable substrate transfer opening. The hoop assembly includes a confinement ring movable between an elevated position and a lowered position. The confinement ring defines a confined confinement region above the substrate support pedestal assembly in the lowered position.

Yet another embodiment of the present invention provides a method for processing a substrate. The method includes transferring a substrate through an opening of a processing chamber to three or more lifting fingers of a hoop assembly disposed in the processing chamber. The hoop assembly comprises a confinement ring defining a cylindrical confinement region therein. The method further includes lowering the hoop assembly to transfer the substrate from the lifting fingers to a substrate support pedestal assembly disposed in the processing chamber, positioning the hoop assembly in a processing position. The confinement region is at least immediately above the substrate disposed on the substrate support pedestal assembly with the confinement ring shielding the opening. The method further includes processing the substrate by supplying a processing gas to the confinement region with the hoop assembly in the processing position.

In the method described above, a height of the confinement ring spans from the substrate to a lower surface of a showerhead positioned above the substrate support pedestal assembly when the hoop assembly is in the processing position. The method above may further include elevating the confinement ring into a cavity formed in a ceiling of the processing chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 5 is a sectional view of a hoop body according to one embodiment of the present invention.

FIG. 6 is a perspective view of a lifting finger according to one embodiment of the present invention.

FIG. 7 is a partial sectional side view of the hoop assembly showing a lift actuator having a bellows according to one embodiment of the present invention.

FIGS. 8A and 8B schematically illustrate the bellows in extended and compressed position.

To facilitate understanding, identical reference numerals have been used, where possible, to designate identical elements that are common to the figures. It is contemplated that elements disclosed in one embodiment may be beneficially utilized on other embodiments without specific recitation

DETAILED DESCRIPTION

Embodiments of the present invention provide apparatus and methods for fabricating devices on a semiconductor substrate. More particularly, embodiments of the present invention relate to a substrate transfer apparatus having a structure for bounding a movable confinement region within a process volume of a processing chamber. The structure for bounding a movable confinement region may also be utilized without features for transferring a substrate within the processing chamber.

Embodiments of the present invention provide a hoop assembly for use in a chamber, such as a processing chamber or a load lock chamber. The hoop assembly includes three or more lifting fingers and a confinement ring. A lift actuator may be utilized to move the hoop assembly up and down. The hoop assembly can be used to pick up a substrate from a substrate support pedestal assembly using the lifting fingers, and to allow robot blades to transfer substrates in an out of the chamber by transferring the substrates to and from the lifting fingers. The confinement ring has a cylindrical inner wall that is substantially symmetric and defines and radially bounds a confinement region within a processing volume of the chamber. The confinement ring can be moved to a position circumscribing the substrate and substrate support pedestal assembly to create a symmetric confinement region around and immediately above the substrate by surrounding the substrate with its inner wall, thus eliminating processing non-uniformity cased by asymmetric or irregular shapes of the chamber walls, for example the effects of the slit tunnel area that connects the inner chamber volume to a slit valve door. Additionally, the confinement ring also reduces exposure of the slit tunnel area to process chemistry, thus keeping the slit tunnel area clean. The confinement ring may be formed from quartz material to reduce recombination of radicals around the substrate, theoretically increasing the radical flux to the substrate and subsequent process performance.

Figure 1:
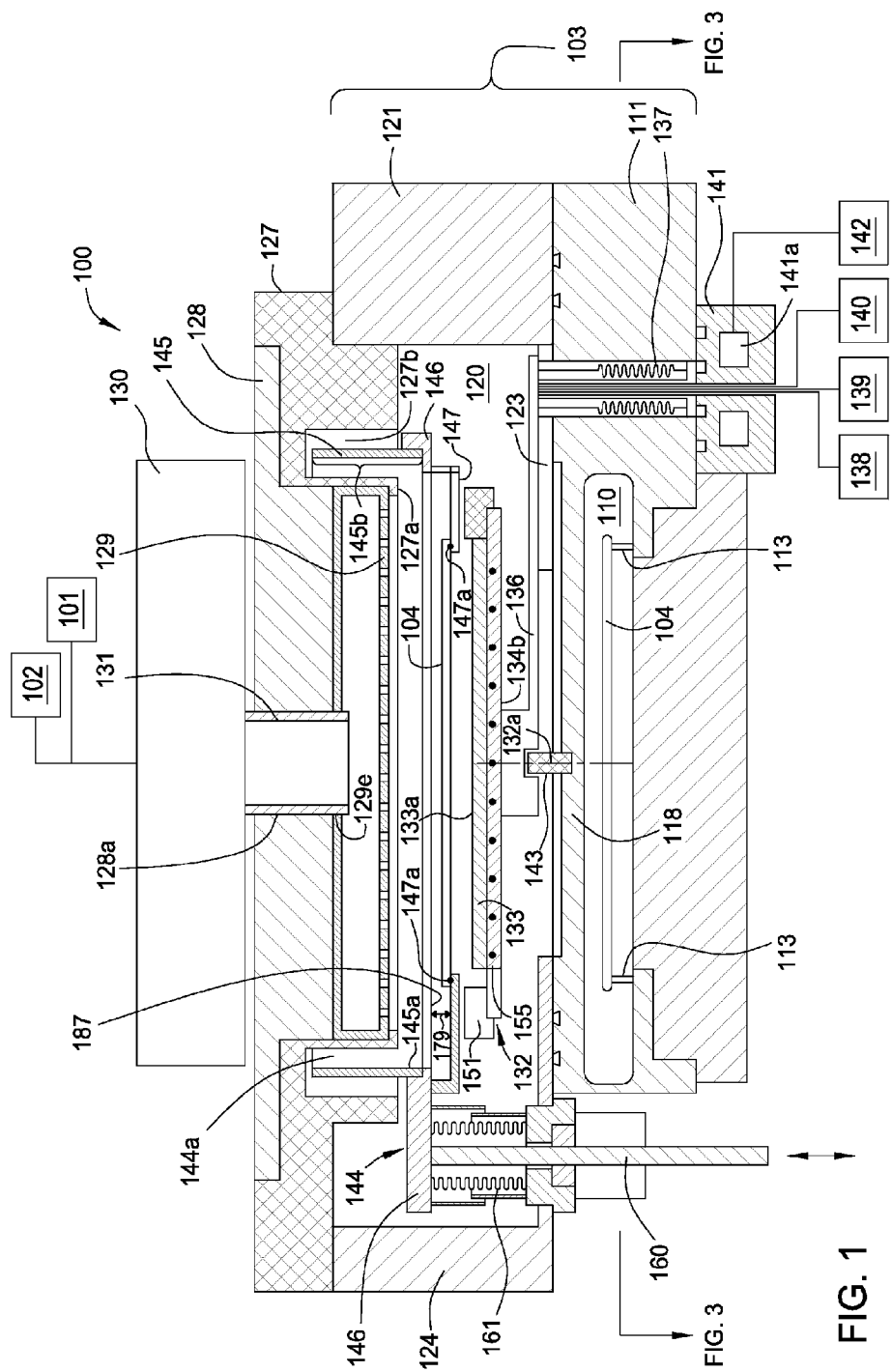
FIG. 1 is a schematic sectional view of a load lock chamber having a hoop assembly according to one embodiment of the present invention.

FIG. 1 is a schematic sectional view of a dual load lock chamber 100 having a hoop assembly 144 according to one embodiment of the present invention. Although the hoop assembly 144 is described in the context of a load lock chamber having a processing volume, is it understood that the hoop assembly 144 may be utilized in any suitably adapted load lock and/or processing chamber, including those having a single processing volume, where it is desirable to have a symmetrical confinement region.

The dual load lock chamber 100 includes an upper chamber volume 120 for transferring and processing a substrate 104, and a lower chamber volume 110 for transferring a substrate 104. The upper chamber volume 120 and the lower chamber volume 110 are vertically stacked and are isolated from one another. Each of the each of the lower and upper load lock volumes 110, 120 may be selectively connectable to two adjacent external environments (i.e., a factory interface and transfer chamber, both not shown) through two openings configured for substrate transferring.

The dual load lock chamber 100 includes a chamber body 103. In one embodiment, the chamber body 103 includes an upper chamber body 121 and a lower chamber body 111 coupled together to define the upper and lower chamber volumes 120, 110.

The dual load lock chamber 100 may include a showerhead 129 disposed over the upper chamber volume 120, a substrate support pedestal assembly 132 disposed within the upper chamber volume 120, a hoop assembly 144 configured to confine a confinement region in the upper chamber volume 120 as well as load and unload substrates. The dual load lock chamber 100 may include supporting pins 113 for supporting a substrate 104 in the lower chamber volume 110.

The upper chamber volume 120 is defined by sidewalls 124 of the upper chamber body 121, a lid ring 127 disposed over the sidewalls 124, a bottom wall 123 of the upper chamber body 121, and an upper wall 118 of the lower chamber body 111. The lid ring 127 has an inner lip 127a holding the showerhead 129 and a source adapter plate 128. The lid ring 127 forms a portion of the ceiling of the upper chamber volume 120. The source adapter plate 128 has a central opening 128a matches with a central opening 129e of the showerhead 129. A remote plasma source 130 is in fluid communication with the upper chamber volume 120 through a quartz insert 131 and the showerhead 129.

The remote plasma source 130 is generally connected to one or more gas panels. In one embodiment, the remote plasma source 130 is connected to a first gas panel 101 configured for providing processing gases for an abatement process to remove residual material after etching and a second gas panel 102 configured for providing processing gases for an ashing process to remove photoresist.

It is also contemplated that one or more plasma generators may be optionally utilized to sustain a plasma within the upper chamber volume 120 in lieu of, or in addition to the remote plasma source 130. The plasma generator may be RF driven coils positioned outside or within the upper chamber volume 120, and/or an RF driven electrode at least one of disposed in the substrate support pedestal assembly 132, above the showerhead 129, or the showerhead 129 itself.

The substrate support pedestal assembly 132 disposed in the upper chamber volume 120 for supporting and heating the substrate 104 using internal heaters (not shown). A focus ring 151 may be disposed on an outer edge of the substrate support pedestal assembly 132. The focus ring 151 functions to retain the substrate 104 and to modify processing rate around an edge area of the substrate 104 during processing.

The substrate support pedestal assembly 132 is mounted on an insulator 143 disposed on the upper wall 118 of the lower chamber body 111. The insulator 143 prevents heat transfer between the substrate support pedestal assembly 132 and the chamber body 103. In one embodiment, the insulator 143 aligns with a central axis 132a of the substrate support pedestal assembly 132 to ensure that the substrate support pedestal assembly 132 remains centered during thermal expansion.

A cantilever tube 136 is attached to a backside 134b near the center of the substrate support pedestal assembly 132. The cantilever tube 136 extends radially outwards to connect with a vertical tube 137. The tubes 136, 137 do not contact the upper chamber body 121 or the lower chamber body 111 to further avoid heat exchange between the substrate support pedestal assembly 132 and the chamber bodies 111, 121. The cantilever tube 136 and the vertical tube 137 provide a passage for power supplies, sensors and other wiring to be used by the substrate support pedestal assembly 132. In one embodiment, a heater power source 138, a sensor signal receiver 139 and a chucking control unit 140 are wired to the substrate support pedestal assembly 132 through the passage in the cantilever tube 136 and the vertical tube 137.

A cooling adaptor 141 is coupled to the vertical tube 137 from outside of the lower chamber body 111. A source for cooling fluid 142 is connected to cooling channels 141a disposed in the cooling adaptor 141. The cooling adaptor 141 controls the rate and direction of heat exchange between the vertical tube 137, the cantilever tube 136, and the substrate support pedestal assembly 132. In one embodiment, thermal breaks, such as bi-metal connectors, may be used for connecting vertical tube 137, the cantilever tube 136, and the substrate support pedestal assembly 132 to thermally isolate the substrate support pedestal assembly 132 from the chamber body 103, thereby allowing more precise control and rapid response of the temperature of the substrate heated by the pedestal assembly 132.

A more detailed description of the upper and lower chamber bodies can be found in U.S. Provisional Patent Application Ser. No. 61/448,027, filed Mar. 1, 2011, entitled "Abatement and Strip Process Chamber in a Dual Load Lock Configuration".

A more detailed description of the substrate support pedestal assembly 132 can be found in U.S. Provisional Patent Application Ser. No. 61/448,018, filed Mar. 1, 2011, entitled "Thin Heated Substrate Support".

The hoop assembly 144 is disposed in the upper chamber volume 120 according to one embodiment of the present invention. As previously stated, the hoop assembly 144 may be used in other processing chambers and/or load lock chambers. The hoop assembly 144 has two functions. First, the hoop assembly 144 is vertically positionable to enable transfer of substrates between the substrate support pedestal assembly 132 and substrate transfer devices (e.g., robot end effectors) entering the upper chamber volume 120. Second, the hoop assembly 144 is also positionable to define a symmetrical confinement region 144a around the substrate 104 and region immediately above the substrate support pedestal assembly 132 during processing, thus, providing a symmetrical processing environment in the upper chamber volume 120 which enhances processing results. The hoop assembly 144 may also be utilized solely for establishing a symmetrical confinement region within a processing volume.

The hoop assembly 144 include a ring-shaped hoop body 146 disposed within the upper chamber volume 120. The ring-shaped hoop body 146 has an inner diameter which is greater than a diameter of the substrate support pedestal assembly 132. The hoop body 146 is coupled to a shaft 160 that extends through the chamber body 103 to a lift actuator 169. The lift actuator 169, such as a linear actuator or motor, is operable to control the vertical elevation of the hoop body 146 within the upper chamber volume 120. In one embodiment, bellows 161 are proved to prevent leakage between the shaft 160 and the chamber body 103.

The hoop assembly 144 also includes three or more lifting fingers 147 are attached to the hoop body 146. The lifting fingers 147 are configured to transfer substrates between the substrate support pedestal assembly 132 and substrate transfer devices, such as robots, extending into the upper chamber volume 120 when the hoop assembly 144 is in an upper transfer position, as shown in FIG. 1. The lifting fingers 147 extend vertically downwards and turn radially inwards from the hoop body 146, terminating in a tip 147a. The tips 147a of the lifting fingers 147 form a substrate support surface configured to support the substrate 104 at several points near an edge region of the substrate 104. A spacing 179 is defined between a lower surface 187 of the hoop body 146 and tips 147a which is sufficient to allow a robot end effector to lift a substrate 104 from the tips 147a of the lifting fingers 147 without hitting the lower surface 187.

The hoop assembly 144 also includes a confinement ring 145 attached to the hoop body 146. The confinement ring 145 extends vertically upwards from the hoop body 146. In one embodiment, the confinement ring 145 is a cylindrical ring having a substantially cylindrical inner wall 145a. The height 145b of the inner wall 145a is much greater than the thickness of the substrate 104 so that the inner wall 145a can confine a portion of the upper processing volume as a symmetrical confinement region 144a around and above the substrate 104. In one embodiment, the height 145b of the inner wall 145a of the confinement ring 145 is much greater than the thickness of the substrate support pedestal assembly 132 to allow the confinement ring 145 to overlap the substrate support pedestal assembly 132 while still extending sufficiently above the substrate 104 disposed on the substrate support pedestal assembly 132. The inner wall 145a of the confinement ring 145 has a diameter greater than the outer diameter of the substrate support pedestal assembly 132. The inner wall 145a of the confinement ring 145 may also have a diameter greater than the outer diameter of the showerhead 129. In one embodiment, the confinement ring 145 has a height sufficient to simultaneously overlap both the substrate support pedestal assembly 132 and showerhead 129 during processing.

Figure 2:
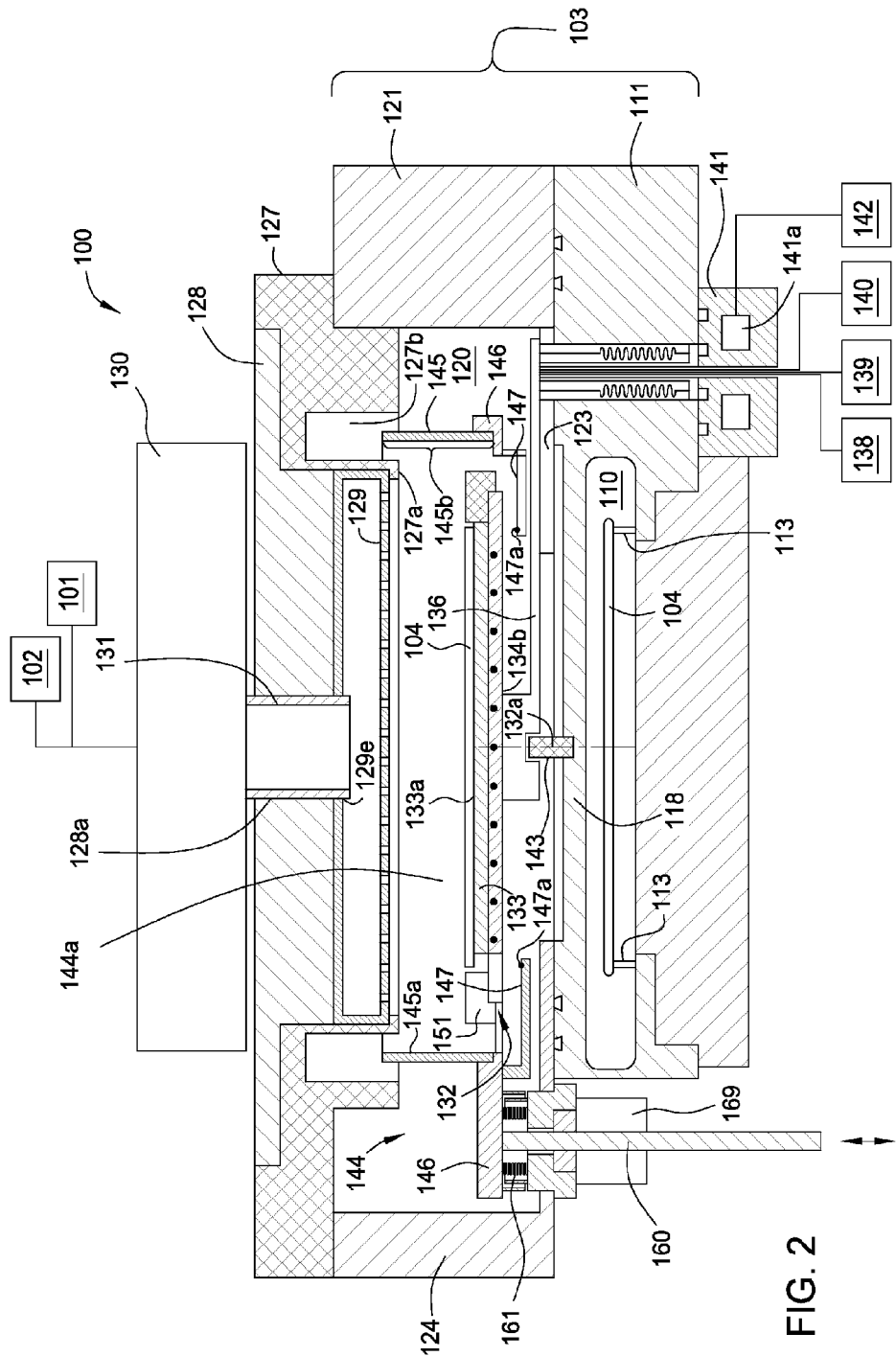
FIG. 2 is a schematic sectional view of the load lock chamber of FIG. 1 with the hoop assembly in a loading/unloading position.

During processing, the lift actuator 169 may position the hoop body 146 in a lowered, processing position, as shown in FIG. 2, so that the confinement ring 145 bounds and thereby creates a cylindrical confinement region 144a within the upper chamber volume 120 around the substrate 104 disposed on the substrate support pedestal assembly 132. In the embodiment depicted in FIG. 2, the cylindrical confinement region 144a within the upper chamber volume 120 has a completely symmetrical cylindrical boundary as the inner wall 145a shields the cylindrical confinement region 144a from asymmetries which may be present in the chamber body 103, such as slit valve tunnels and the like. The symmetrical processing environment provided by the cylindrical confinement region 144a enhances process uniformity by reducing conductance and/or electrical asymmetries which have a negative effect on substrate process uniformity.

The lifting fingers 147 of the hoop assembly 144 are aligned with cut outs 155 formed in the substrate support pedestal assembly 132. As the hoop assembly 144 is lowered, the tips 147a of the lifting fingers 147 pass below the upper surface 133a of the substrate support pedestal assembly 132 and into the cut outs 155 thereby transferring the substrate 104 from the tips 147a of the lifting fingers 147 to the upper surface 133a of the substrate support pedestal assembly 132. Conversely, as the hoop body 146 is raised, the lifting fingers 147 move upward through the cut outs 155 to come in contact with and lift the substrate 104 from the upper surface 133a of the substrate support pedestal assembly 132.

Returning back to FIG. 1, a cavity 127b is formed in the lid ring 127 which accepts the upper portion of the confinement ring 145 when the hoop assembly 144 is in the elevated position. In one embodiment, the cavity 127b is an annular slot. The cavity 127b allows the lifting fingers 147 to be aligned with the slit valve tunnel (not shown) thereby enabling substrate transfer with the robot end effector (also not shown) without having increasing the volume of the upper chamber volume 120 to accommodate the motion of the confinement ring 145 which would disadvantageously result in slower pumping times, increase gas usage, larger pumps, higher energy consumption and higher chamber fabrication costs.

Figure 3:
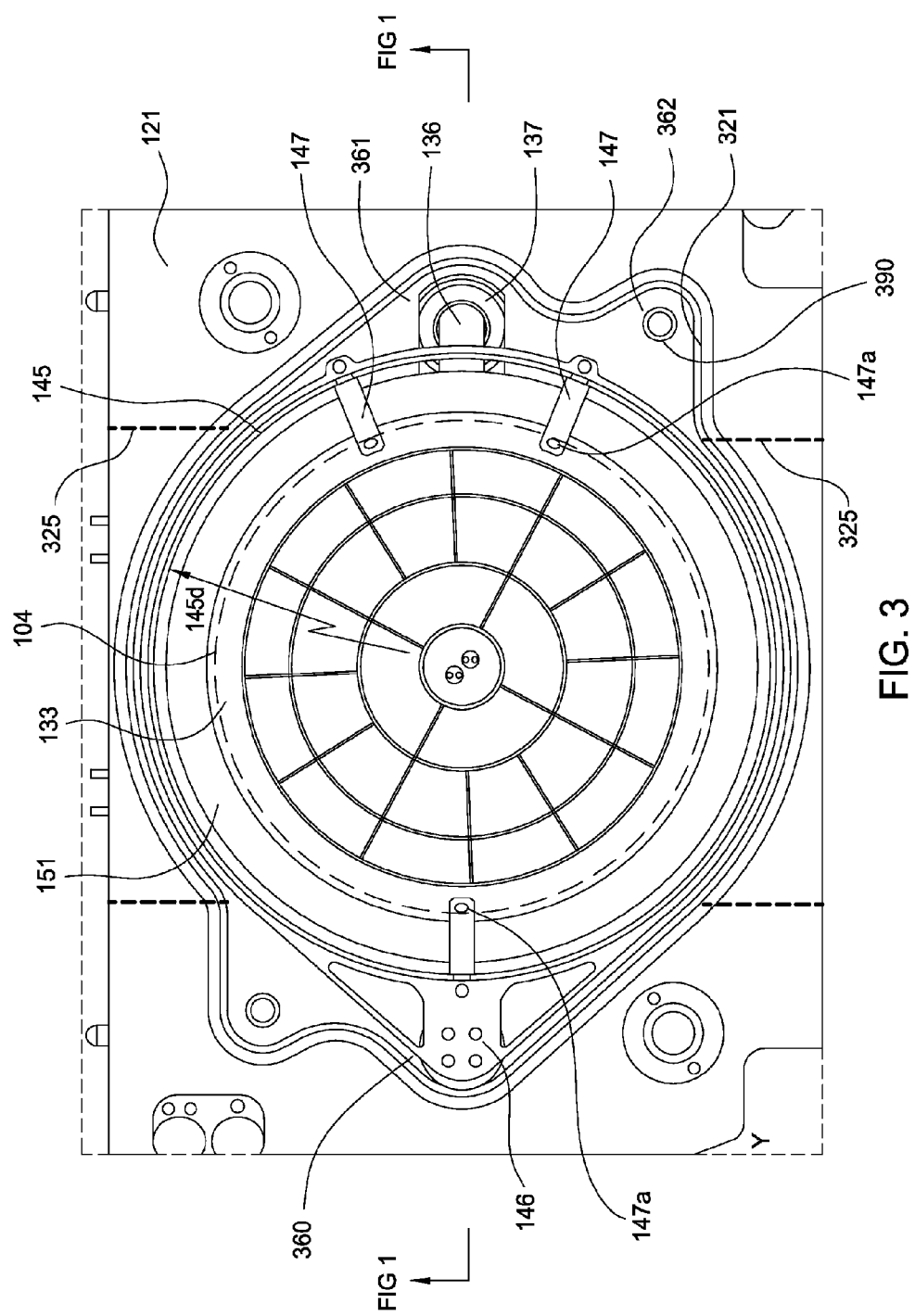
FIG. 3 is a schematic top view of a load lock chamber having a hoop assembly according to one embodiment of the present invention.

FIG. 3 schematically illustrates a top view of the hoop assembly 144 positioned within the upper chamber volume 120 of the upper chamber body 121 with the showerhead 129 removed. Two substrate transfer openings 325 are formed through the sidewalls 124 to allow substrate transferring and passage of external robots. A slit valve door (not shown) may be attached outside of each opening 325 to selectively seal the upper chamber volume 120 from the adjacent environments external to the upper chamber volume 120.

The hoop body 146 and the confinement ring 145 have an inner diameter 145d large enough surround the substrate 104 and substrate support pedestal assembly 132, thereby, defining and bounding the symmetrical confinement region 144a directly above the substrate 104. The lifting fingers 147 extend radially inward from the hoop body 146 and the confinement ring 145 to a diameter less than that of the substrate 104 and substrate support pedestal assembly 132, thereby allowing the fingers 147 to support the substrate 104 when lifted above the substrate support pedestal assembly 132.

In the embodiment shown in FIG. 3, three lifting fingers 147 are used to define a substrate supporting surface. The three lifting fingers 147 are arranged so that the lifting fingers 147 do not interfere with the robot end effectors extending into the upper chamber volume 120 through the openings 325. In one embodiment, the lifting fingers 147 form a Y shape with single lifting finger 147 on the side of the hoop body 146 connected to the shaft 160 and the remaining pair of lifting fingers 147 located on the opposite side of the hoop body 146 and spaced equidistant from the single lifting finger 147.

As shown in FIG. 3, the upper chamber body 121 has an irregular (e.g., not cylindrical) inner wall 321 with openings 325 for slit valve doors positioned on opposite sides and extra cut outs 360, 361, 362 for the shaft 160, the vertical tube 137 connected to the substrate support pedestal assembly 132, and vacuum ports 390. The confinement ring 145 is positioned around the substrate support pedestal assembly 132 to shield processing region (e.g., containment region 144a) above the substrate 104 from the irregular shape of the inner wall 321 of the upper chamber body 121 (such as the substrate transfer openings 325) and provide substantially symmetrical vertical boundary radially around the substrate support pedestal assembly 132 and region of the processing volume directly thereabove. In one embodiment, the confinement ring 145 and the substrate support pedestal assembly 132 are substantially concentric.

Figure 4:
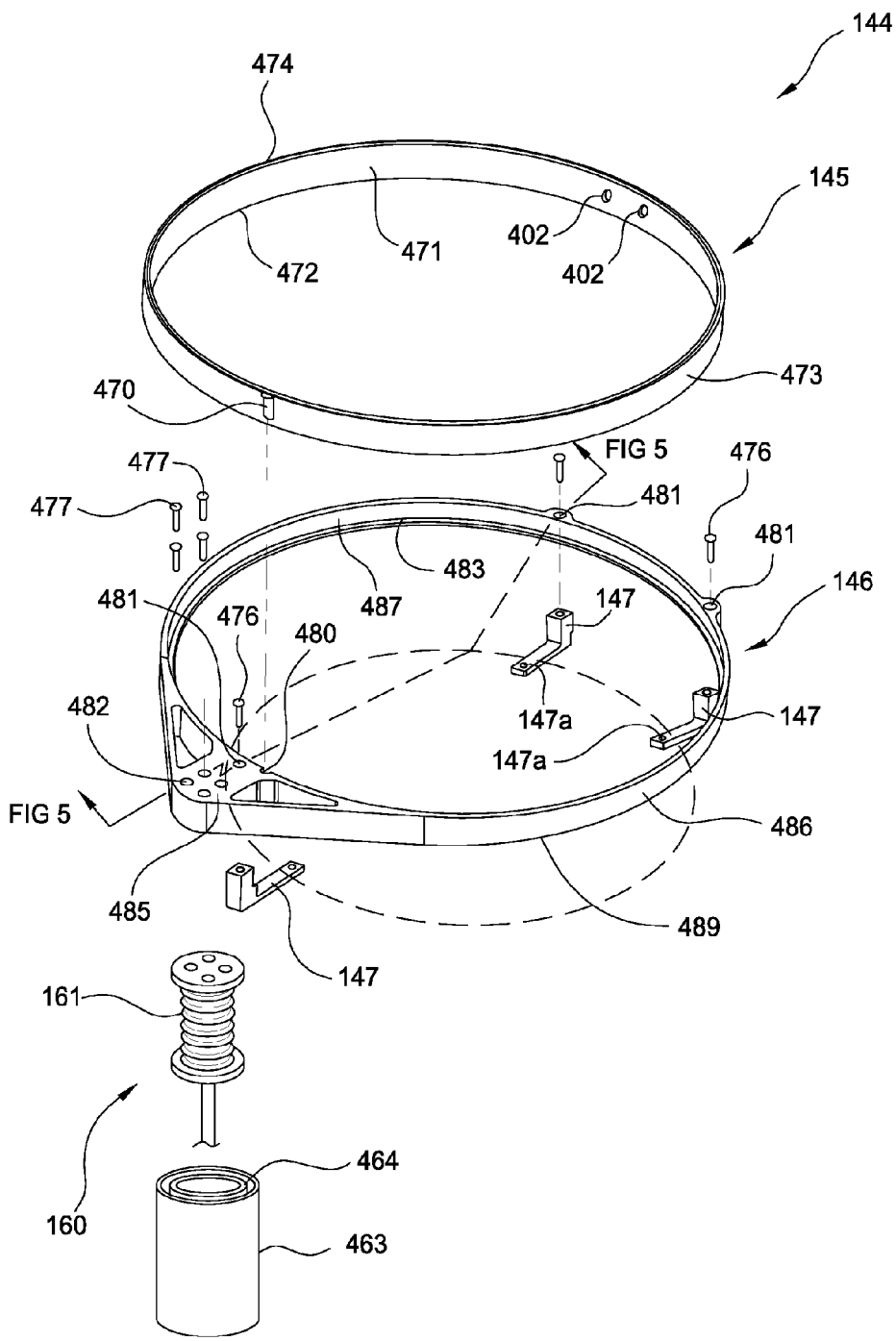
FIG. 4 is an exploded view of the hoop assembly according to one embodiment of the present invention.

FIG. 4 is an exploded view of the hoop assembly 144 according to one embodiment of the present invention. An inner lip 483 of the hoop body 146 extends radially inward and provides a substantially planar surface supporting the confinement ring 145. The lifting fingers 147 may be attached to a lower surface 489 of the hoop body 146 using suitable fasteners, adhesives or other fastening method. In one embodiment, screws 476 may be used to attach the lifting fingers 147 to the hoop body 146. The bellows 161 attached to an upper end of the shaft 160 may be attached to a handle portion 485 of the hoop body 146. In one embodiment, the bellows 161 may be attached to the hoop body 146 by one or more screws 477. One or more shields 463, 464 may be disposed around the bellows 161 to reduce particle contamination resulting from the motion of the bellows 161.

In one embodiment, the confinement ring 145 is a cylindrical sleeve ring whose inner surface 471 is a cylindrical wall. An upper end 474 and the lower end 472 of the confinement ring 145 may be substantially parallel to one another. The confinement ring 145 may include one or more through holes 402 to allow viewing of the confinement region through the confinement ring 145. In one embodiment, the confinement ring 145 may be formed from quartz. The quartz confinement ring 145 together with the quartz showerhead 129 creates a quartz lining for the plasma during processing, therefore, reducing species recombination and particle contamination.

A substantially vertical ridge 470 is formed on an outer surface 473 of the confinement ring 145. The vertical ridge 470 may not extend completely to the bottom the lower end 472 of the confinement ring 145 to ensure the correct orientation of the confinement ring 145, as further discussed below.

In one embodiment, the hoop body 146 includes a frame portion 486 having a cylindrical inner wall 487 and the handle portion 485 extending radially outward from the frame portion 486 on one side. A substantially vertical notch 480 may be formed in the cylindrical inner wall 487 of the frame portion 486. The notch 480 may not extend completely to the inner lip 483 of the hoop body 146. The notch 480 mates with the ridge 470 of the confinement ring 145, thereby locating the confinement ring 145 to the hoop body 146 when assembled, as illustrated in FIG. 4A. Since the vertical ridge 470 extends from the upper end 474, the confinement ring 145 will only lay flat on the hoop body 146 if the ridge 470 is engaged with the notch 480 with the lower end 472 of the of the confinement ring 145 oriented towards the hoop body 146, thereby preventing installation of the confinement ring 145 in an up-side-down orientation.

Figure 4B:
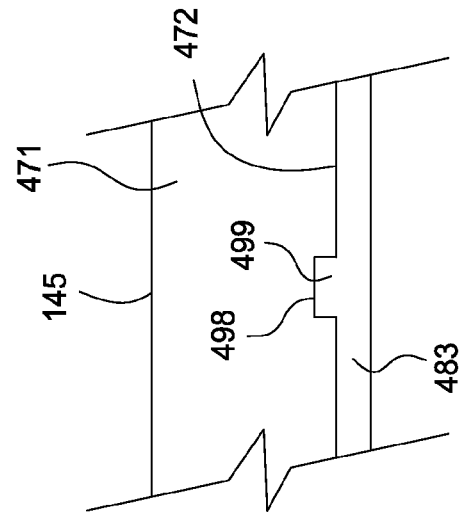
FIG. 4B is a partial view of a sector of the hoop assembly viewing outward from the center of the hoop assembly.
Figure 4A:
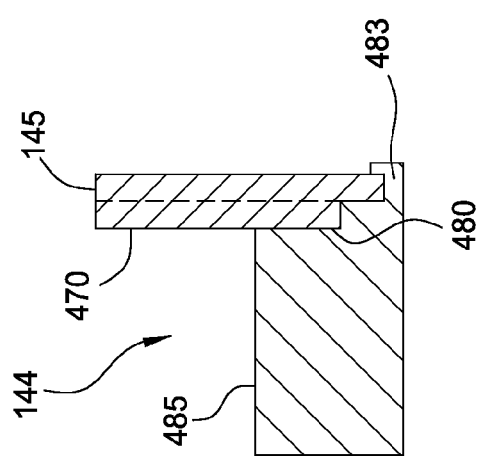
FIG. 4A is a partial sectional view of the hoop assembly.

Referring to the partial view of the hoop assembly depicted in FIG. 4B, one or more raised locating features 499 are extending upwards from the inner lip 483 of the hoop body 146. Each of the one or more raised locating features 499 mate with an associated slot 498 formed in the lower end 472 of the of the confinement ring 145. The mating locating features 499 and slots 498 ensure a predefined angular orientation of the confinement ring 145 relative to the hoop body 146 that aligns the through holes 402 to allow viewing of the confinement region through the confinement ring 145 by a metrology sensor (not shown). In one embodiment, the hoop body 146 has three locating features 499 spaced on the inner lip 483 of the hoop body 146 while the confinement ring 145 has three similarly space slots 498. The three or more raised locating features 499 create a plane for the confinement ring 145 to rest thereon so that the confinement ring 145 does not tip or tilt.

To assemble, the ridge 470 of the confinement ring 145 and the notch 480 of the hoop body 146 are first aligned, and the confinement ring 145 is slip-fit inside the cylindrical inner wall 487 so that the lower end 472 of the confinement ring 145 rests on the inner lip 483 of the hoop body 146. The ridge 470 of the confinement ring 145 is locked in the notch 480 preventing relative motions between the confinement ring 145 and the hoop body 146. In one embodiment, the confinement ring 145 is removable disposed on the hoop body 146 to allow easy replacement.

Through holes 481, 482 may be formed through the hoop body 146 for mounting the lifting fingers 147 and the bellows 161 respectively. In one embodiment, both the lifting fingers 147 and the bellows 161 are attached to the hoop body 146 from a lower surface 489 of the hoop body 146.

FIG. 5 is a sectional view of the hoop body 146 along section 5-5 lines shown in FIG. 4. The hoop body 146 may be formed from a metal. In one embodiment, the hoop body 146 is formed from aluminum. The lower surface 489 of the hoop body 146 may be substantially flat. An upper surface 588 of the hoop body 146 may be slanted to reduce the thickness and to reduce bulk of hoop body 146 from the handle portion 485 to the frame portion 486.

FIG. 6 is a perspective view of the lifting finger 147 according to one embodiment of the present invention. Each lifting finger 147 may have an L shape with a vertical portion 677 connected to a horizontal portion 678. A hole 676 may be formed on the vertical portion 677 and a threaded insert 675 may be disposed in the hole 676. The threaded insert 675 is configured to mate with the screw 476 for attaching the lifting finger 147 to the hoop body 146. The contact tip 147a is positioned on an upper surface 679 of the horizontal portion 678. When attached to the hoop body 146, the vertical portion 677 of the lifting finger 147 creates the spacing 179 between the lower surface 489 of the hoop body 146 and the contact tips 147a. The spacing 179 allows passage of substrates.

The vertical portion 677 and horizontal portion 678 of the lifting finger 147 may be formed from a metal. In one embodiment, the vertical portion 677 and horizontal portion 678 are formed from aluminum. The threaded insert 675 may be formed from a wear and galling resistive material, such as NITRONIC® stainless steel. The contact tip 147a may be formed from a ceramic material to reduce particle generation from contacting the substrate. In one embodiment, the contact top 147a may be formed from silicon nitride. The contact tip 147a may include a ball or other raised feature 602 to reduce the area of surface contact with the substrate.

FIG. 7 is a partial sectional side view of the hoop assembly 144 showing the bellows 161 according to one embodiment of the present invention. Two shields 463, 464 are disposed around convolutions 761 of the bellows 161 to prevent particles from entering and becoming entrapped in the convolutions 761. In one embodiment, the bellows 161 is formed from a corrosion resistant material, for example HAYNES® 242 alloy.

In one embodiment, the convolutions 761 of the bellows 161 are designed to keep particles away from the high stress location to extend the life time of the bellows 161.

FIGS. 8A and 8B schematically illustrate a portion of the convolutions 761 of the bellows 161 in extended and compressed position. A concaved curve 862 is formed near an internal welded location 863 where has high stress. As shown in FIG. 8A, while the convolutions 761 are at extended position, external particles may enter the convolutions 761 along path 861. As the convolutions 761 extend and compress (shown in FIG. 8B), the concaved curve 862 would remains concaved and the particles are eventually gathered at the bottom of the concaved curve 862 where there are more clearance and lower stress. Thus the bellows 161 prevents particles from moving towards the internal welded location 863, thus, avoiding further stressing the internal welded location 863.

The hoop assembly 144 according to embodiments of the present invention has several advantages. First, the hoop assembly saves space and simplifies the rest of the chamber design. Second, the hoop assembly allows the chamber body geometry to be decoupled from the substrate confinement region geometry, providing symmetrical or other predetermined substrate confinement region even if the chamber body has irregular shape to accommodate other chamber components. Third, the hoop assembly allows the substrate processing area to be surrounded by material different than the chamber body. For example quartz, instead of aluminum, may be used to confine the processing environment to reduce radical recombination of the plasma within the processing area.

Furthermore, the geometry of the confinement ring 145 and the focus ring 151 around the substrate support pedestal assembly 132 may be sized to control the gas conductance therebetween. The conductance between confinement ring 145 and the focus ring 151 may be selected to be high relative to a conductance between the top of the confinement ring 145 and the lid ring 127, thereby causing the majority of gas to flow downward inside the confinement ring 145 through the confinement region where the substrate 104 is located.

Even though a cylindrical hoop is described in the exemplary embodiments, the hoop can be designed to have other shapes to meet design requirement. For example, a rectangular hoop may be used in chambers for transfer or processing rectangular substrates wherein the rectangular hoop still provides a symmetrical confinement region. Even though embodiments of the present invention are described above in application of load lock chambers, embodiments of the present invention can be applied to any process chamber.

While the foregoing is directed to embodiments of the present invention, other and further embodiments of the invention may be devised without departing from the basic scope thereof, and the scope thereof is determined by the claims that follow.

What is claimed is:

1. A hoop assembly for use in a processing chamber, comprising:
   a confinement ring defining a confinement region therein, wherein the confinement ring is a sleeve ring having a vertically extended side wall with one or more through holes formed between an inner surface and an outer surface of the vertically extended side wall, the confinement ring having a ridge disposed on the outer surface, the ridge extending from an upper end of the confinement ring;
   a hoop body having a lip extending radially inward at a lower surface of the hoop body and supporting the confinement ring thereon, the confinement ring extending vertically upwards above an upper surface of the hoop body, the hoop body having a notch formed in an inner surface thereof and mating with the ridge of the confinement ring, the hoop body having a handle portion and a frame portion, the hoop body is slanted from the handle portion to the frame portion to reduce a thickness of the hoop body, the one or more through holes of the confinement ring aligned opposite the handle portion of the hoop body when the ridge of the confinement ring is mated with the notch of the hoop body; and
   three or more lifting fingers attached to the lower surface of the hoop body and extending downwards, wherein each of the three or more lifting fingers has a contact tip positioned radially inward from the hoop body to form a substrate support surface below and spaced apart from the confinement region.

2. The hoop assembly of claim 1, wherein each of the three or more lifting fingers comprises:
   a vertical portion attached to the lower surface of the hoop body; and
   a horizontal portion connected to the vertical portion at a ninety degree angle and extending radially inward from the hoop body, wherein the contact tip is positioned on the horizontal portion.

3. The hoop assembly of claim 1, wherein the frame portion defines a central opening, the frame portion is connected to the handle portion at one side outside the central opening, and the notch is positioned adjacent to the handle portion.

4. The hoop assembly of claim 3, further comprising:
a shaft attached to the handle portion of the hoop body.

5. The hoop assembly of claim 1, wherein the confinement ring is formed from quartz, and the hoop body is formed from aluminum.

6. A chamber for processing a substrate, comprising:
a chamber body defining an upper chamber volume and a lower chamber volume therein, the lower chamber volume directly below and isolated from the upper chamber volume, the chamber body having a sealable substrate transfer opening;
a substrate support pedestal assembly disposed in the upper chamber volume;
a hoop assembly moveable within the upper chamber volume, wherein the hoop assembly comprises:
  a confinement ring defining a confinement region therein, wherein the confinement ring is a sleeve ring having a vertically extended side wall with one or more through holes formed between an inner surface and an outer surface of the vertically extended side wall, the confinement ring having a ridge disposed on the outer surface, the ridge extending from an upper end of the confinement ring;
  a hoop body having a lip extending radially inward at a lower surface of the hoop body and supporting the confinement ring thereon, the confinement ring extending vertically upwards above an upper surface of the hoop body, the hoop body having a notch formed in an inner surface thereof and mating with the ridge of the confinement ring, the hoop body having a handle portion and a frame portion, the hoop body is slanted from the handle portion to the frame portion to reduce a thickness of the hoop body, the one or more through holes of the confinement ring aligned opposite the handle portion of the hoop body when the ridge of the confinement ring is mated with the notch of the hoop body; and
  three or more lifting fingers, each attached to the lower surface of the hoop body and extending downwards, wherein each of the three or more lifting fingers includes a vertical portion and a horizontal portion, wherein the horizontal portion has a contact tip positioned radially inward from the hoop body to form a substrate support surface below and spaced apart from the confinement region, wherein the confinement ring is movable between an elevated position and a lowered position, and wherein the confinement region is above the substrate support pedestal assembly when the hoop assembly is in the lowered position.

7. The chamber of claim 6, wherein the elevated position of the confinement ring is above the sealable substrate transfer opening and the lowered position of the confinement ring is in front of the sealable substrate transfer opening.

8. The chamber of claim 6, further comprising:
a showerhead disposed above the substrate support pedestal assembly, wherein a height of the confinement ring spans from a lower surface of the showerhead and an upper surface of the substrate support pedestal assembly.

9. The chamber of claim 6, further comprising:
a lid having a cavity receiving the confinement ring when the confinement ring is in the elevated position.

10. The chamber of claim 6, further comprising:
a cantilever tube attached to a backside of the substrate support pedestal assembly, the cantilever tube extending radially outward, the cantilever tube spaced apart from the chamber body.

11. The chamber of claim 6, wherein the confinement ring has a height that at least spans from the substrate support pedestal assembly to an elevation above the sealable substrate transfer opening.

12. The chamber of claim 6, wherein the confinement ring is formed from quartz.

13. The chamber of claim 6, wherein
the horizontal portion is connected to the vertical portion at a ninety degree angle.

14. A hoop assembly for use in a processing chamber, comprising:
a confinement ring defining a confinement region therein, the confinement ring having a ridge disposed on an outer surface thereof, the ridge extending from an upper end of the confinement ring;
a hoop body comprising a handle portion and a frame portion, the hoop body is slanted from the handle portion to the frame portion to reduce a thickness of the hoop body, the hoop body having a lip extending radially inward at a lower surface of the hoop body and supporting the confinement ring thereon, the confinement ring extending vertically upwards above an upper surface of the hoop body, the hoop body having a notch formed in an inner surface thereof and mating with the ridge of the confinement ring; and
three or more lifting fingers, each fastened to the lower surface of the hoop body by a screw and extending downwards, each of the three or more lifting fingers having a vertical portion and a horizontal portion, the horizontal portion having a contact tip positioned radially inward from the hoop body to form a substrate support surface below and spaced apart from the confinement region, wherein the confinement ring is movable between an elevated position and a lowered position.

15. The chamber of claim 6, wherein the frame portion defines a central opening.

* * * * *